US009506777B2

(12) United States Patent
Lai et al.

(10) Patent No.: US 9,506,777 B2
(45) Date of Patent: Nov. 29, 2016

(54) MICRO-ELECTROMECHANICAL APPARATUS HAVING SIGNAL ATTENUATION-PROOF FUNCTION, AND MANUFACTURING METHOD AND SIGNAL ATTENUATION-PROOF METHOD THEREOF

(71) Applicant: Sagatek Co., Ltd., Taipei (TW)

(72) Inventors: Kelvin Yi-Tse Lai, Taipei (TW); Jung-Hsiang Chen, Taipei (TW); Cheng-Szu Chen, Taipei (TW); Shu-Yi Weng, Taipei (TW)

(73) Assignee: SAGATEK CO., LTD., Taipei (TW)

(*) Notice: Subject to any disclaimer, the term of this patent is extended or adjusted under 35 U.S.C. 154(b) by 0 days.

(21) Appl. No.: 14/885,656

(22) Filed: Oct. 16, 2015

(65) Prior Publication Data

US 2016/0041009 A1    Feb. 11, 2016

Related U.S. Application Data

(63) Continuation-in-part of application No. 14/200,735, filed on Mar. 7, 2014, now abandoned.

(30) Foreign Application Priority Data

Mar. 8, 2013 (TW) .............................. 102108324 A

(51) Int. Cl.
*G01D 5/24* (2006.01)
*B81B 7/00* (2006.01)
*B81C 1/00* (2006.01)

(52) U.S. Cl.
CPC ............... *G01D 5/24* (2013.01); *B81B 7/008* (2013.01); *B81C 1/00698* (2013.01); *B81B 2201/0235* (2013.01); *B81B 2201/033* (2013.01); *B81B 2207/012* (2013.01)

(58) Field of Classification Search
CPC ........ G01D 5/24; B81C 1/00698; B81B 7/008
See application file for complete search history.

(56) References Cited

U.S. PATENT DOCUMENTS

| | | | |
|---|---|---|---|
| 4,746,377 A | 5/1988 | Kobayashi et al. | |
| 5,189,593 A | 2/1993 | Ooi | |
| 6,169,008 B1 | 1/2001 | Wen et al. | |
| 6,284,617 B1 | 9/2001 | Erdeljac et al. | |
| 6,355,534 B1 | 3/2002 | Cheng et al. | |
| 7,671,710 B2 | 3/2010 | Yoshida et al. | |
| 8,106,723 B2* | 1/2012 | Watanabe | H03H 9/02409 331/116 M |
| 8,142,670 B2* | 3/2012 | Kouma | G02B 26/0841 216/11 |
| 8,833,175 B2* | 9/2014 | Chandrasekharan | G01N 13/00 29/847 |
| 2011/0120221 A1* | 5/2011 | Yoda | B81B 3/0086 73/514.32 |
| 2013/0283913 A1* | 10/2013 | Lin | G01P 15/125 73/514.32 |
| 2014/0203403 A1* | 7/2014 | Shimanouchi | H02N 1/006 257/532 |

OTHER PUBLICATIONS

Gianchandani et al., "A MEMS-First Fabrication Process for Integrating CMOS Circuits with Polusilicon Microstrutures", IEEE, Micro Electro Mechanical Systems, pp. 257-262, Dec. 1998.

* cited by examiner

*Primary Examiner* — William Coleman
(74) *Attorney, Agent, or Firm* — Muncy, Geissler, Olds & Lowe, P.C.

(57) ABSTRACT

A micro-electromechanical apparatus having a signal attenuation-proof function, and a manufacturing method and a signal attenuation-proof method thereof are disclosed. The micro-electromechanical apparatus includes a substrate, an insulation layer, and a sensing unit. The substrate has a doped region in which a majority of conductive carriers have the same polarity as an electronic signal. The insulation layer is located on the substrate, and the sensing unit is located above the insulation layer and forms the electronic signal when sensing a force.

20 Claims, 9 Drawing Sheets

MICRO-ELECTROMECHANICAL APPARATUS HAVING SIGNAL ATTENUATION-PROOF FUNCTION, AND MANUFACTURING METHOD AND SIGNAL ATTENUATION-PROOF METHOD THEREOF

CROSS-REFERENCE TO RELATED APPLICATIONS

This continuation-in-part application claims priority under 35 U.S.C. §119(a) on patent application Ser. No. 14/200,735 filed in U.S. on Mar. 7, 2014 and claiming priority on Patent Application No(s). 102108324 filed in Taiwan, R.O.C. on Mar. 8, 2013, the entire contents of which are hereby incorporated by reference.

TECHNICAL FIELD

The disclosure relates to a micro-electromechanical apparatus, and more particularly to a micro-electromechanical apparatus having a signal attenuation-proof function and to a manufacturing method and a signal attenuation-proof method thereof, so as to prevent an electronic signal from signal loss.

BACKGROUND

For the semiconductor fabrication of semiconductor devices, metal layers and oxide layers are very commonly used. Take a micro-electromechanical system (MEMS) device as an example. The MEMS device usually has metal layers and oxide layers layered and can integrate an application-specific integrated circuit (ASIC) and a MEMS together in the same surface, thereby simplifying its packaging process. However, between the MEMS device and the material of its peripheral structure the parasitic effect exists.

To produce a MEMS device, its mechanical structure has to be transformed to an equivalent circuit, and then this equivalent circuit will be integrated with the ASIC to produce a system-on-chip (SoC). However, most MEMS devices usually are constructed on silicon substrates. When electronic signals are transmitted in the MEMS device, parasitic capacitors may be formed between the MEMS device and the silicon substrate. Therefore, a part of the electronic signal may flow in the silicon substrate and become lost. In other words, such parasitic capacitors may reduce the intensity of the electronic signal traveling in the MEMS device, that is, reduce the output power of the electronic signal. Moreover, such parasitic capacitors may complicate the design of a next stage of signal processing circuits.

SUMMARY

According to one or more embodiments, the disclosure provides a micro-electromechanical apparatus having a signal attenuation-proof function. In one embodiment, the micro-electromechanical apparatus may include a substrate, an insulation layer, and a sensing unit. The substrate may have a doped region into which impurities are doped are doped. The insulation layer is located on the substrate. The sensing unit is located above the insulation layer, includes a mass bulk, movable electrodes, fixed electrodes, and elastic components. The movable electrodes are spaced from and face the fixed electrodes respectively, the elastic components suspend the mass bulk, and the mass bulk is coupled with the movable electrodes. The mass bulk and the movable electrodes vibrate in response to a force. When the mass bulk and the movable electrodes are vibrating together, an electronic signal having a polarity equal to a polarity of a majority of conductive carriers in the doped region is formed and propagates in the sensing unit.

In another embodiment of the micro-electromechanical apparatus, the mass bulk contains polycrystalline silicon, and the elastic components are metallic.

In yet another embodiment of the micro-electromechanical apparatus, the doped impurities are made of a Group 5 or Group 3 material.

In yet another embodiment, the micro-electromechanical apparatus further includes a controller electrically connected to the substrate and the sensing unit. The controller determines whether the mass bulk has left a default position without the force, and to calibrate the control voltage to recover the default position of the mass bulk when the mass bulk has left the default position without the force.

In yet another embodiment of the micro-electromechanical apparatus, the controller determines whether capacitances between the fixed electrodes and the movable electrodes are different from a default capacitance; and when the capacitances between the fixed electrodes and the movable electrodes are different from the default capacitance, the controller determines that the mass bulk has left the default position without the force.

In yet another embodiment of the micro-electromechanical apparatus, the control voltage has the same potential as the electronic signal.

According to one or more embodiments, the disclosure also provides a manufacturing method of a micro-electromechanical apparatus. In one embodiment, the manufacturing method may include the following steps. Form a substrate having a doped region into which impurities are doped. Form an insulation layer on the substrate. Form a sensing unit including a mass bulk, movable electrodes, fixed electrodes, and elastic components above the insulation layer. The movable electrodes are spaced from and face the fixed electrodes respectively, the mass bulk is coupled with the movable electrodes, and the elastic components suspend the mass bulk. When the mass bulk and the movable electrodes are vibrating together in response to a force applied to the micro-electromechanical apparatus, an electronic signal having a polarity equal to a polarity of a majority of conductive carriers in the doped region is formed and propagates in the sensing unit.

In another embodiment of the manufacturing method, the mass bulk contains polycrystalline-silicon, and the elastic components are metallic.

In another embodiment of the manufacturing method, the doped impurities are made of a Group 5 or Group 3 material.

In another embodiment, the manufacturing method further includes disposing a controller electrically connected to the substrate and the sensing unit.

According to one or more embodiments, the disclosure provides another micro-electromechanical apparatus having a signal attenuation-proof function. In one embodiment, the micro-electromechanical apparatus includes a substrate, an insulation layer located on the substrate, and a sensing unit located above the insulation layer. The substrate receives a control voltage. The sensing unit includes a mass bulk, movable electrodes, fixed electrodes, and elastic components. The movable electrodes are spaced from and face the fixed electrodes respectively. The elastic components suspend the mass bulk. The mass bulk is coupled with the movable electrodes. The mass bulk and the movable electrodes vibrate in response to a force. When the mass bulk and the movable electrodes are vibrating together, an electronic signal having a polarity equal to a polarity of the control voltage is formed and propagates in the sensing unit.

In another embodiment, the micro-electromechanical apparatus further includes a controller electrically connected to the substrate and the sensing unit. The controller determines whether the mass bulk has left a default position without the force, and calibrates the control voltage to recover the default position of the mass bulk when the mass bulk has left the default position without the force.

In yet another embodiment of the micro-electromechanical apparatus, the controller determines whether capacitances between the fixed electrodes and the movable electrodes are different from a default capacitance; and when the capacitances between the fixed electrodes and the movable electrodes are different from the default capacitance, the controller determines that the mass bulk has left the default position without the force.

In yet another embodiment of the micro-electromechanical apparatus, the mass bulk contains polycrystalline silicon, and the elastic components are metallic.

According to one or more embodiments, the disclosure provides a signal attenuation-proof method applied to a micro-electromechanical apparatus including a substrate, an insulation layer on the substrate, and a sensing unit above the insulation layer. The sensing unit includes a mass bulk, movable electrodes, fixed electrodes, and elastic components. The movable electrodes are spaced from and face the fixed electrodes respectively. The elastic components suspend the mass bulk, and the mass bulk is coupled with the movable electrodes. The mass bulk and the movable electrodes vibrate in response to a force applied to the micro-electromechanical apparatus. The signal attenuation-proof method includes providing the substrate with a control voltage having a polarity equal to a polarity of an electronic signal generated and propagating within the sensing unit when the force is applied to the micro-electromechanical apparatus.

In another embodiment, the signal attenuation-proof method further includes determining whether the mass bulk has left a default position without the force; and calibrating the control voltage to recover the default position of the mass bulk when the mass bulk has left the default position without the force.

In yet another embodiment of the signal attenuation-proof method, determining whether the mass bulk has left the default position without the force comprises: determining whether capacitances between the fixed electrodes and the movable electrodes are different from a default capacitance; and determining that the mass bulk has left the default position without the force when the capacitances between the fixed electrodes and the movable electrodes are different from the default capacitance.

In yet another embodiment of the signal attenuation-proof method, the substrate has a doped region into which impurities are doped, and a polarity of a majority of conductive carriers in the doped region is equal to the polarity of the electronic signal.

In yet another embodiment of the signal attenuation-proof method, the doped impurities are made of a Group 5 or Group 3 material. The disclosure dopes impurity atoms in the doped region of the substrate or directly applies a control voltage to the substrate to make the polarity of the doped region equal to the polarity of the electronic signal in the sensing unit, so repulsion may occur between the substrate and the sensing unit. Therefore, the electronic signal may be prevented from the signal loss, to maintain the intensity of the electronic signal at an optimal level to increase the output power of the electronic signal, and the signal processing circuits may also be simplified.

BRIEF DESCRIPTION OF THE DRAWINGS

The present disclosure will become more fully understood from the detailed description given herein below for illustration only, and thus does not limit the present disclosure, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

The disclosure involves with a micro-electromechanical system (MEMS) apparatus, such as an acoustic sensor (e.g. a microphone), a pressure sensor, an altimeter, a flowmeter, or a tactile sensor. In an example, a capacitive MEMS apparatus is a device to convert an input force (e.g. voice, pressure, etc.) to a sensing signal and is based on a principle of a condenser that enables two electrodes to face each other. Here, one electrode is fixed on a substrate and the other electrode is afloat in the air whereby the capacitive MEMS apparatus moves in reaction to the input force using a diaphragm. When the input force is received, the diaphragm vibrates and a capacitance value varies according to a change in a gap between two electrodes. Accordingly, the input force can be transformed to a readable capacitance value for the production of such a sensing signal when an electric charge current as an electronic signal, flowing through an equivalent capacitor between the two electrodes is sampled and processed in the follow-up stage.

Figure 1A:
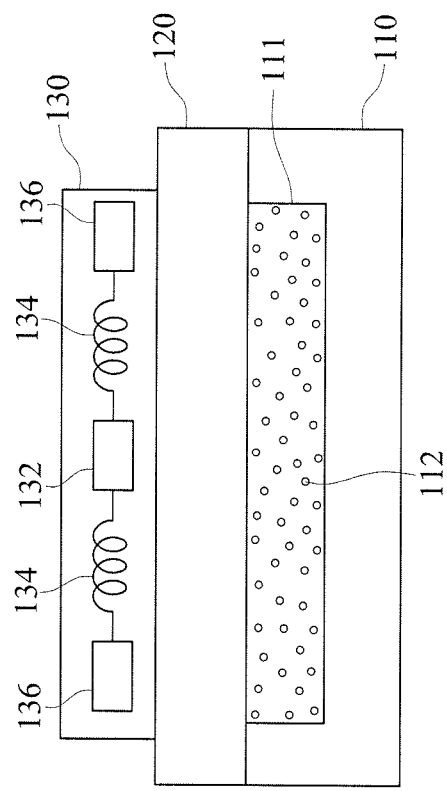
FIG. 1A is a schematic cross-sectional view of a micro-electromechanical apparatus in an embodiment.
Figure 1B:
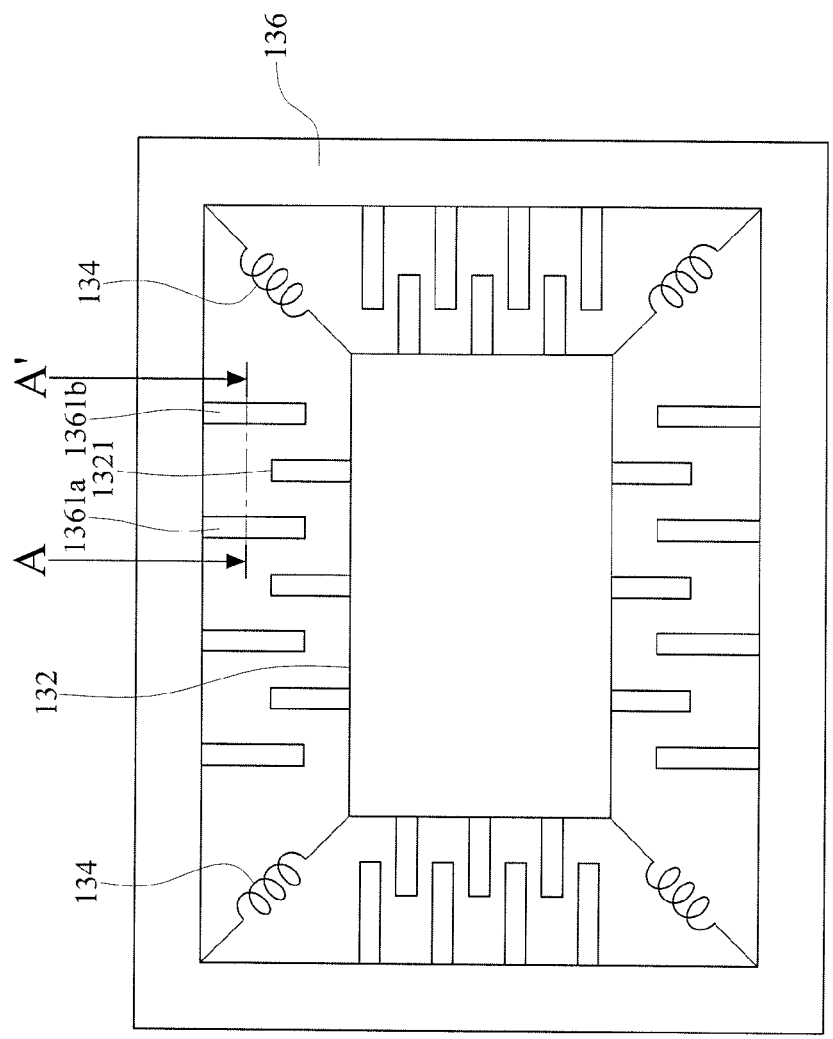
FIG. 1B is a schematic top view of a sensing unit in an embodiment.
Figure 1C:
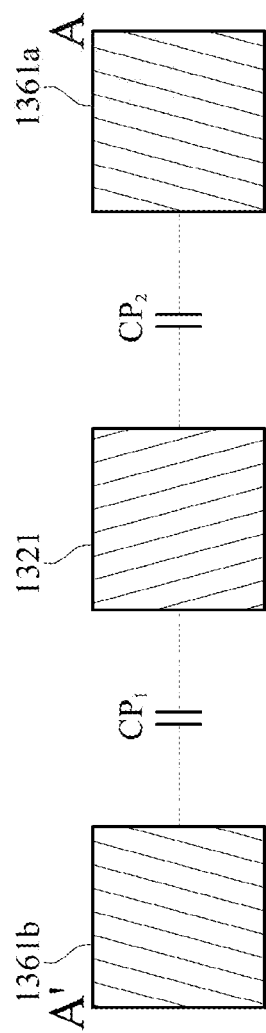
FIG. 1C is a schematic cross-sectional view of fixed and movable electrodes in the sensing unit along a cross-sectional line A-A'.

Please refer to FIG. 1A to FIG. 1C. FIG. 1A is a schematic cross-sectional view of a micro-electromechanical apparatus 100 in the disclosure, FIG. 1B is a schematic top view of a sensing unit in an embodiment, and FIG. 1C is a schematic cross-sectional view of fixed and movable electrodes in the sensing unit along a cross-sectional line A-A'. The micro-electromechanical apparatus 100 is manufactured by a MEMS technology and has a signal attenuation-proof function. The micro-electromechanical apparatus 100 is, for example, not limited to a microphone, a pressure sensor, an altimeter, a flowmeter, or a tactile sensor. The micro-electromechanical apparatus 100 at least includes a substrate 110, an insulation layer 120, and a sensing unit 130.

The substrate 110 has a doped region 111 which impurity atoms 112 (referred to as impurities) are doped into, so a majority of conductive carriers in the doped region 111 have the same polarity with an electronic signal propagating within the sensing unit 130 when the electronic signal is generated in response to an input force. In other words, the substrate 110 has the same polarity with the electronic signal. For example, the doped impurity atoms 112 in the doped region 111 are made of, for example, not limited to, a Group 5 or Group 3 material. The majority of conductive carriers in the doped region 111 are, for example, electrons or holes. In one embodiment, while the doped impurity atoms 112 in the doped region 111 belong to Group 3, these conductive carriers are holes; and alternately, while the doped impurity atoms 112 in the doped region 111 belong to Group 5, these conductive carriers are electrons. For example, the substrate 110 may be a P type or N type silicon substrate.

The insulation layer 120 is located on/above the substrate 110 and brings shielding effect to the MEMS system. In one embodiment, the insulation layer 120 may be formed through the thin film deposition. In an embodiment, the material of the insulation layer 120 is a dielectric material such as, not limited to, an oxide material, or a nitride material.

The sensing unit 130 may be located on/above the insulation layer 120 and be capable of sensing an input force after being powered. The sensing unit 130 may at least include a mass bulk 132 (known as a diaphragm or a membrane), a plurality of elastic components 134 coupled with the mass bulk 132, a ring 136 coupled with the elastic components 134, a plurality of movable electrodes 1321, and a plurality of fixed electrodes 1361a and 1361b (referred to as fixed electrodes 1361). In an embodiment, the mass bulk 132 has one or more through holes. The movable electrodes 1321 are coupled with the mass bulk 132, and the fixed electrodes 1361 are coupled with the ring 136.

As described in FIG. 1B, the elastic components 134 disposed between the mass bulk 132 and the ring 136 are used to suspend the mass bulk 132, the mass bulk 132 and the movable electrodes 1321 have respective gaps with the insulation layer 120 and the ring 136, the movable electrodes 1321 have respective gaps with the fixed electrodes 1361 and the ring 136. Therefore, the mass bulk 132 and the movable electrodes 1321 can vibrate together in response to the force, and capacitors CP1 and CP2 can be formed between the movable electrodes 1321 and the fixed electrodes 1361 as shown in FIG. 1C. The disclosure have no limitations on the shape and material of the mass bulk 132, the shape and material of the ring 136, the material and shape of the elastic components 134, the arrangements of the elastic components 134 coupled with the ring 136 and the mass bulk 132, the arrangement, shapes and material of the movable electrodes 1321, the arrangement, shapes and material of the fixed electrodes 1361, the distance between the mass bulk 132 and the ring 136, and the distance between the mass bulk 132 and the insulation layer 120; and the person skilled in the art can design them according to actual requirements.

In an embodiment, the sensing unit 130 is electrically connected to an analog to digital convertor (ADC). When an input force is applied to the sensing unit 130 after a first voltage is applied to the movable electrodes 1321 and a second voltage is applied to the fixed electrodes 1361, the mass bulk 132 will vibrate in response to the force and the parasitic capacitors CP1 and CP2 will be formed between the movable electrodes 1321 and the fixed electrodes 1361 and will change in response to the vibration of the mass bulk 132. Therefore, an electronic signal will flow through the mass bulk 132, the elastic components 134, and the fixed electrodes 1361, and the ring 136 and is converted into a sensing signal by the ADC for the follow-up application.

For example, the mass bulk 132 may be made of polycrystalline silicon or another possible material with a small thermal expansion coefficient, and the elastic component 134 may be metallic or metalloid. For example, the elastic component 134 is not limited to a spring.

In an embodiment with respect to the impurity atoms 112 made of a Group 5 element, the impurity atoms 112 may be doped in the doped region 111 via an ion implanter or an impurity diffuser, but the disclosure will not be limited thereto. Since the impurity atoms 112 belonging to Group 5 present the attribute of electrons, the majority of conductive carriers in the doped region 111 are electrons whose polarities are negative and cause that the polarity of the doped region 111 is substantially negative. In this equivalent circuit, when the electronic signal carrying negative charges flows in the sensing unit 130, the electronic signal may have a fewer electricity leakage flowing to the substrate 110 since repulsion may occur between the electronic signal and the substrate 110. Therefore, the electronic signal may only be transmitted through the sensing unit 130.

Accordingly, via the design of the doped region 111 of the micro-electromechanical apparatus 100, the insulation layer 120 between the substrate 110 and the sensing unit 130 may be prevented from forming parasitic capacitors that will cause some signal loss leaking to the substrate 110, so that the electronic signal propagating within the sensing unit 130 may maintain its original intensity without attenuation.

Figure 1D:
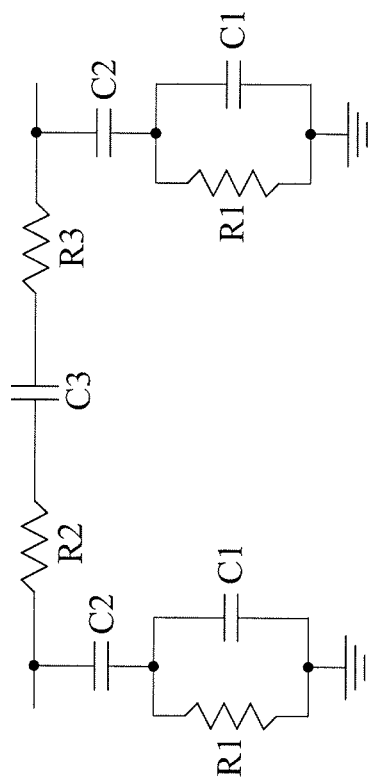
FIG. 1D is a schematic view of a parasitic equivalence circuit in FIG. 1A.

Referring to FIG. 1D, a parasitic equivalence circuit in FIG. 1A is shown. The substrate 110 may be equivalently determined as a parasitic resistor R1 and a parasitic capacitor C1. The insulation layer 120 may be equivalently determined as a parasitic capacitor C2. The sensing unit 130 may be equivalently determined as a parasitic resistor R2, a parasitic resistor R3, and a parasitic capacitor C3. Specifically, the parasitic resistor R2 may be formed based on the mass bulk 132, the parasitic resistor R3 may be formed based on the elastic components 134, and the parasitic capacitor C3 may be formed based on the mass bulk 132, the elastic component 134 and the ring 136. The connection between each of the parasitic resistors R1, R2 and R3 and each of the parasitic capacitors C1, C2 and C3 may be referred to what is shown in FIG. 1D, and thus will not be repeated hereinafter.

Accordingly, for the micro-electromechanical apparatus 100, since the electronic signal may be transmitted in the sensing unit 130, the electronic signal may be prevented from flowing toward the substrate 110. In other words, the electronic signal may be transmitted to the output end through the parasitic resistor R2, the parasitic capacitor C3, and the parasitic resistor R3 rather than through the parasitic capacitor C2, the parasitic resistor R1, and the parasitic capacitor C1. In this way, the electronic signal may be prevented from the signal loss, so that the intensity and output power of the electronic signal may be maintained at its original value.

On the other hand, a mass bulk and a ring in a sensing unit are substantially coplanar or are substantially at the same level in a micro-electromechanical apparatus after the micro-electromechanical apparatus is just manufactured. However, elastic components coupled with the mass bulk and the ring may lose their elasticity bit by bit during the lifespan of the micro-electromechanical apparatus so the mass bulk and the ring may deviate from the coplanarity or be at different levels. Specifically, the mass bulk becomes lower than the level the ring stays at. In other words, the mass bulk has left its default position without any force applied to the micro-electromechanical apparatus. The repulsion effect herein may become insufficient for avoiding the occurrence of signal leakage flowing toward the substrate and then noises or errors may occur to the sensing signal. For this, the disclosure provides another embodiment of the micro-electromechanical apparatus that is capable of recovering the position of the mass bulk, as described below. Also, in order to concisely illustrate the disclosure, the following embodiments of the sensing unit is based on that the mass bulk, the movable electrodes, the fixed electrodes, and the ring are predeterminedly disposed at the same level.

Figure 3:
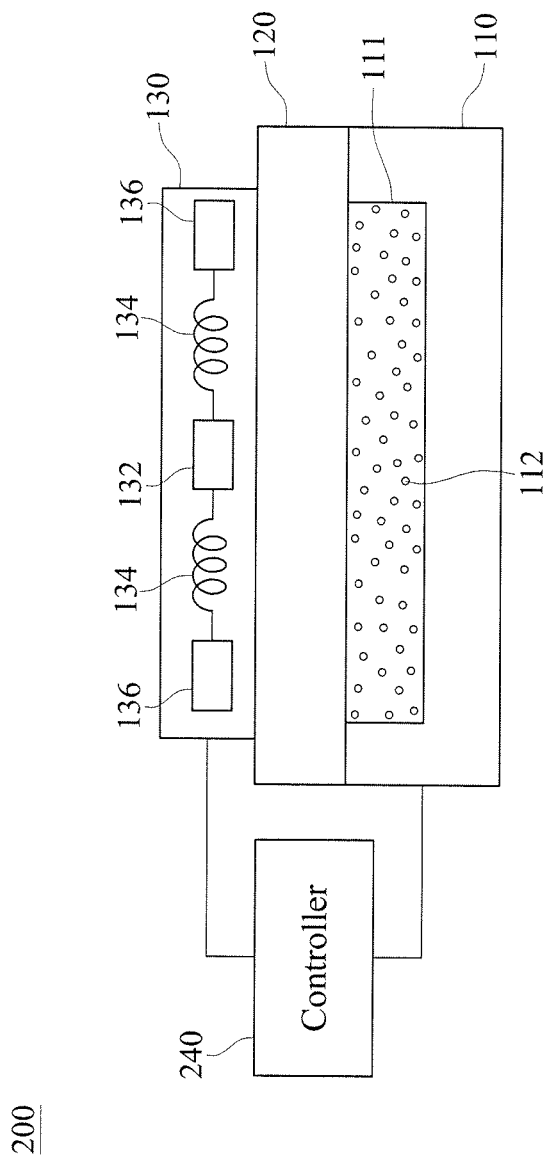
FIG. 3 is a schematic view of a micro-electromechanical apparatus in another embodiment.

Please refer to FIG. 3, where a micro-electromechanical apparatus 200 is shown. The micro-electromechanical apparatus 200 at least includes a substrate 110, an insulation layer 120, a sensing unit 130, and a controller 240. The substrate 110, the insulation layer 120 and the sensing unit 130 in the micro-electromechanical apparatus 200 are the same as the substrate 110, the insulation layer 120 and the sensing unit 130 in the micro-electromechanical apparatus 100 and thus, can be referred to the previous description with respect to the micro-electromechanical apparatus 100 shown in FIG. 1A and FIG. 1B.

The controller 240 is electrically connected to the substrate 110 and the sensing unit 130. The controller 240 determines whether the mass bulk 132 has left its default position without any input force, for example, determining whether the mass bulk 132 is lower than the ring 136 when no input force is applied. When the mass bulk 132 has left its default position without any input force, the controller 240 will provide the substrate 110 with a control voltage having the same polarity as the electronic signal in order to recover the default position of the mass bulk 132. In this or some embodiments, the potential of the control voltage is set according to how much the mass bulk 132 has left its default position.

In an embodiment, since the movable electrodes 1321 and the mass bulk are coupled together and the fixed electrodes 1361 and the ring 136 are coupled together, determining whether the mass bulk 132 has left its default position without any input force can be performed by determining whether the movable electrodes 1321 and the fixed electrodes 1361 are at the same level. Moreover, in an embodiment, if the controller 240 has stored a default capacitance between the movable electrode 1321 and each of the fixed electrodes 1361 in storage, the controller 240 can use this information to determine whether the movable electrodes 1321 and the fixed electrodes 1361 are at the same level. That is, the controller 240 determines whether present capacitances between the movable electrodes 1321 and the fixed electrodes 1361 are substantially equal to their respective default capacitances. When the present capacitances between the movable electrodes 1321 and the fixed electrodes 1361 are different from their respective default capacitances, the controller 240 will determines that the mass bulk 132 has left its default position without any input force.

Figure 2:
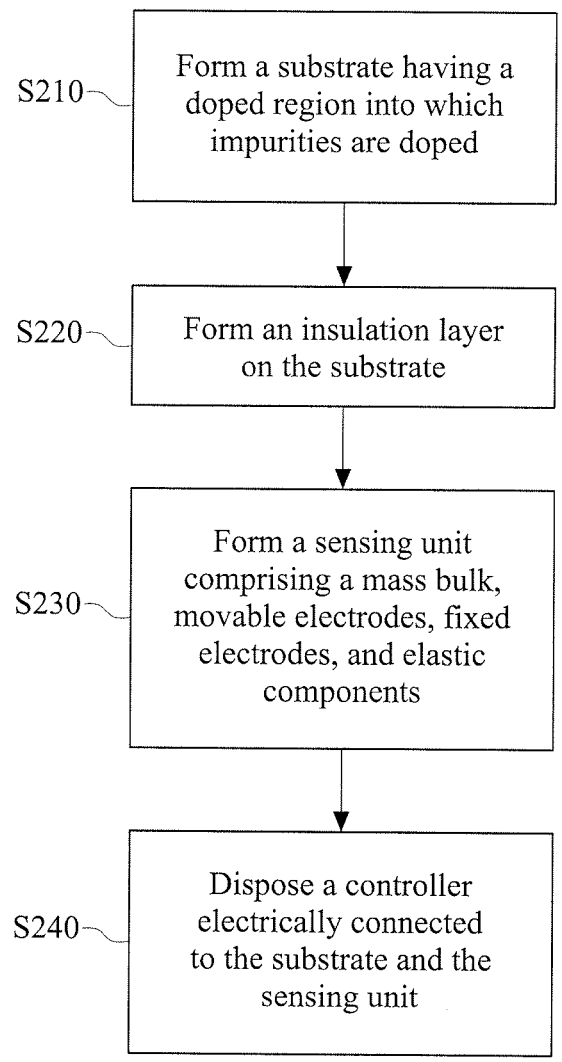
FIG. 2 is a flow chart of a manufacturing method of a micro-electromechanical apparatus in an embodiment.

FIG. 2 is a flow chart of a manufacturing method of a micro-electromechanical apparatus in one or more embodiments. To concisely describe the disclosure, the manufacturing method is applied to the micro-electromechanical apparatus 200, for example, and the substrate 110 is a silicon substrate in an example. First, as shown in step S210, dope the impurity atoms 112 in the doped region 111 of the substrate 110. In one embodiment, the impurity atoms 112 may be doped into the substrate 110 via a doping apparatus such as an ion implanter or an impurity diffuser, but the disclosure will not be limited thereto.

In this case, in doped region 111, a majority of conductive carriers in the doped region 111 have the same polarity as the electronic signal. The doped impurity atoms 112 may belong to Group 5 or Group 3, and thus, the conductive carriers may be electrons or holes. That is, while the doped impurity atoms 112 belong to Group 3, the conductive carriers are holes, and while the doped impurity atoms 112 belong to Group 5, the conductive carriers are electrons.

Then, as shown in step S220, form the insulation layer 120 on the substrate 110. In one embodiment, the insulation layer 120 may be formed through the thin film deposition. Finally, form the sensing unit 130 including the mass bulk 132, the elastic components 134, the movable electrodes 1321, the fixed electrodes 1361 and the ring 136 on/above the insulation layer 120 (step S230). The movable electrodes 1321 are spaced from and face the fixed electrodes 1361 respectively, the mass bulk 132 is coupled with the movable electrodes 1321, and the elastic components 134 suspend the mass bulk 132. When the mass bulk 132 and the movable electrodes 1321 are vibrating together in response to a force applied to the micro-electromechanical apparatus 100, an electronic signal having a polarity equal to a polarity of a majority of conductive carriers in the doped region 111 is formed and propagates in the sensing unit 130. Other details of the micro-electromechanical apparatus 100 having a signal attenuation-proof function can be referred to the aforementioned description with respect to FIG. 1A and FIG. 1B.

Accordingly, the micro-electromechanical apparatus 100 may have fewer parasitic capacitors formed within the insulation layer 120, so as to prevent the electronic signal from the signal loss flowing toward the substrate 110 and maintain the intensity of the electronic signal.

Then, in step S240, a controller 240 is disposed and is electrically connected to the substrate 110 and the sensing unit 130. Through the operation of the controller 240, the repulsion effect may still be sufficient for avoiding the occurrence of signal leakage flowing toward the substrate 110 even though the elastic components 134 loss their elasticity bit by bit during their lifespan.

The method of avoiding signal attenuation occurring to the above electronic signal in the foregoing micro-electromechanical apparatus 200 can be summarized in a signal attenuation-proof method as described as follows.

Figure 4:
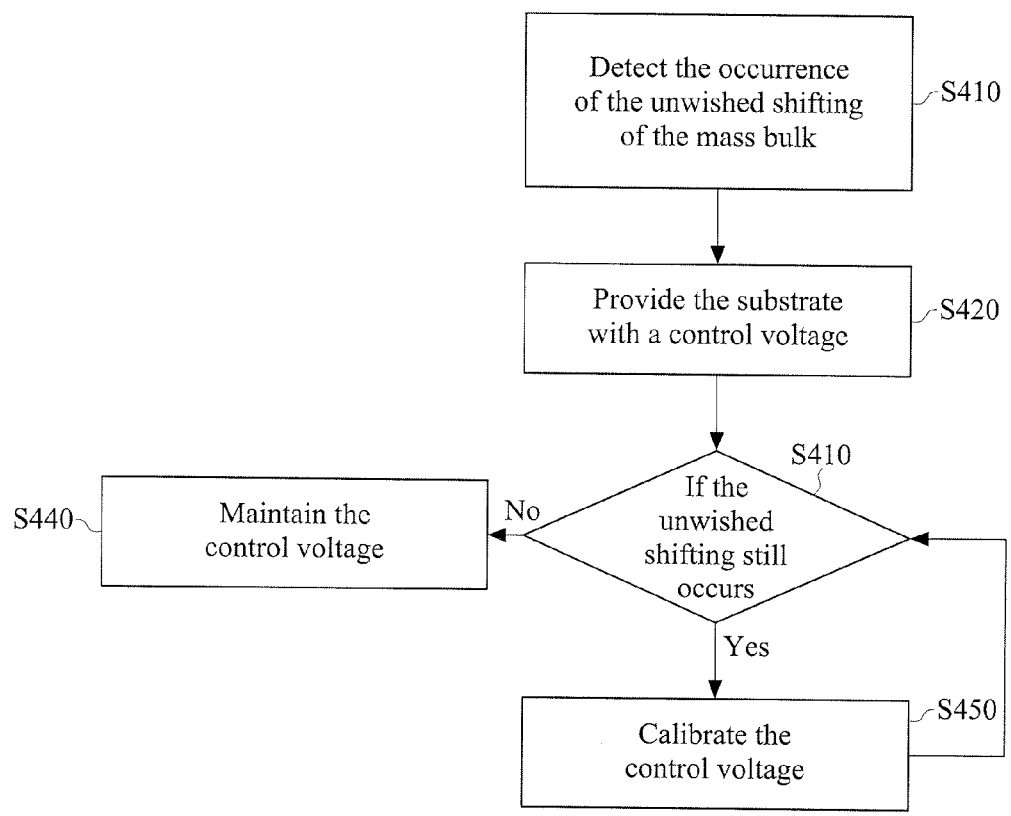
FIG. 4 is a flow chart of a signal attenuation-proof method of the micro-electromechanical apparatus in an embodiment.

FIG. 4 is a flow chart of a signal attenuation-proof method of the aforementioned micro-electromechanical apparatus 200 in an embodiment. The signal attenuation-proof method includes the following steps. In step S410, detect the occurrence of the unwished shifting of the mass bulk 132. That is, determine whether the mass bulk 132 has left its default position without an input force. When the unwished shifting of the mass bulk 132 occurs, a control voltage is provided to the substrate 110, as shown in step S420. The control voltage has a polarity equal to a polarity of an electronic signal generated and propagating within the sensing unit 130 when the force is applied to the micro-electromechanical apparatus 200. Then, in step S430, detect whether the unwished shifting of the mass bulk 132 still occurs. If the mass bulk 132 has returned to its default position, the control voltage maintains at the current value, as shown in step S440. If the unwished shifting of the mass bulk 132 still occurs, the control voltage is being calibrated until the mass bulk 132 has returned to its default position or until the control voltage arrives at its limitation, as shown in step S450. The detailed information about the detection of the unwished shifting of the mass bulk 132 and the structure of the micro-electromechanical apparatus 200 can be referred to the previous description.

Figure 5:
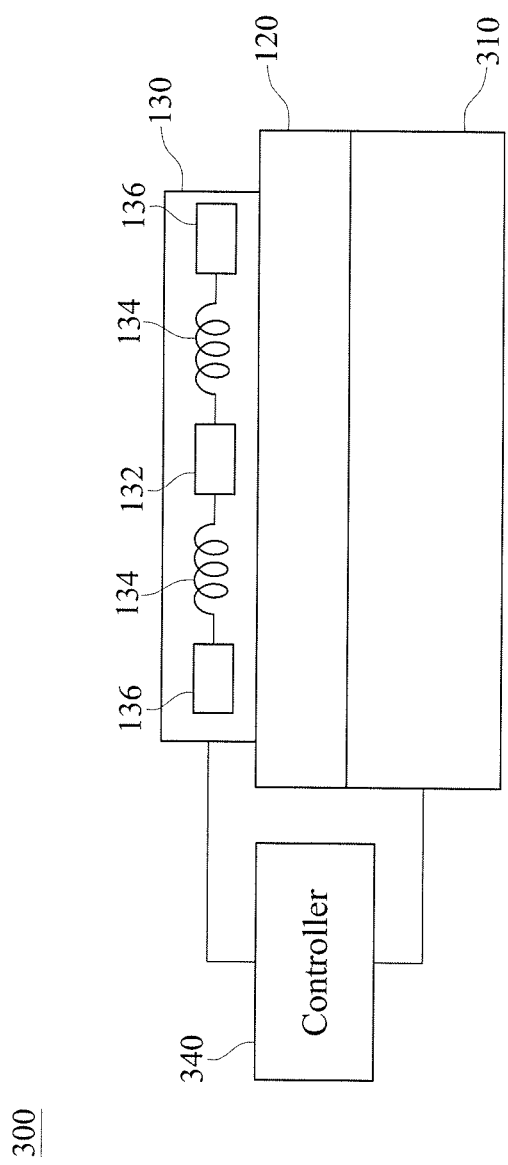
FIG. 5 is a schematic view of a micro-electromechanical apparatus in another embodiment.

In addition to doping a substrate to control the polarity of the substrate, other embodiments of controlling the polarity of the substrate may also be contemplated as follows. Please refer to FIG. 5, which is a schematic view of a micro-electromechanical apparatus 300 in another embodiment. The micro-electromechanical apparatus 300 is similar to the micro-electromechanical apparatus 200. The micro-electromechanical apparatus 300 at least includes a substrate 310, an insulation layer 120, a sensing unit 130, and a controller 340. The insulation layer 120 and the sensing unit 130 in the micro-electromechanical apparatus 300 are the same as the insulation layer 120 and the sensing unit 130 in the micro-electromechanical apparatus 100 and thus, can be referred to the previous description with respect to FIG. 1A to FIG. 1C. Differences between the micro-electromechanical apparatuses 200 and 300 are the designs in the substrate and the controller. The substrate 310 can have a doped region or not. The controller 340 directly and continuously provides the substrate 310 with a control voltage having a polarity equal to a polarity of an electronic signal generated in response to an input force and propagating in the sensing unit 130. Therefore, repulsion effect may occur between the sensing unit 130 and the substrate 310, and then the electronic signal propagating in the sensing unit 130 may have no signal leakage flowing toward the substrate 310.

Also, the controller 340 determines whether the mass bulk 132 has left its default position when no input force is applied. When the mass bulk 132 has left its default position without any input force, the controller 340 will calibrate (e.g. increase or decrease) the control voltage in order to make the mass bulk 132 return to its default position. Therefore, noises or errors caused by the unwished shifting of the mass bulk 132 may not occur to the sensing signal.

The detailed descriptions about the determination of the position of the mass bulk 132, the control of the control voltage, and the components and operation of the micro-electromechanical apparatus 300 can be referred to the previous embodiments.

Accordingly, the method of avoiding signal attenuation occurring to the above electronic signal in the foregoing micro-electromechanical apparatus 300 can be summarized in a signal attenuation-proof method as described below.

Figure 6:
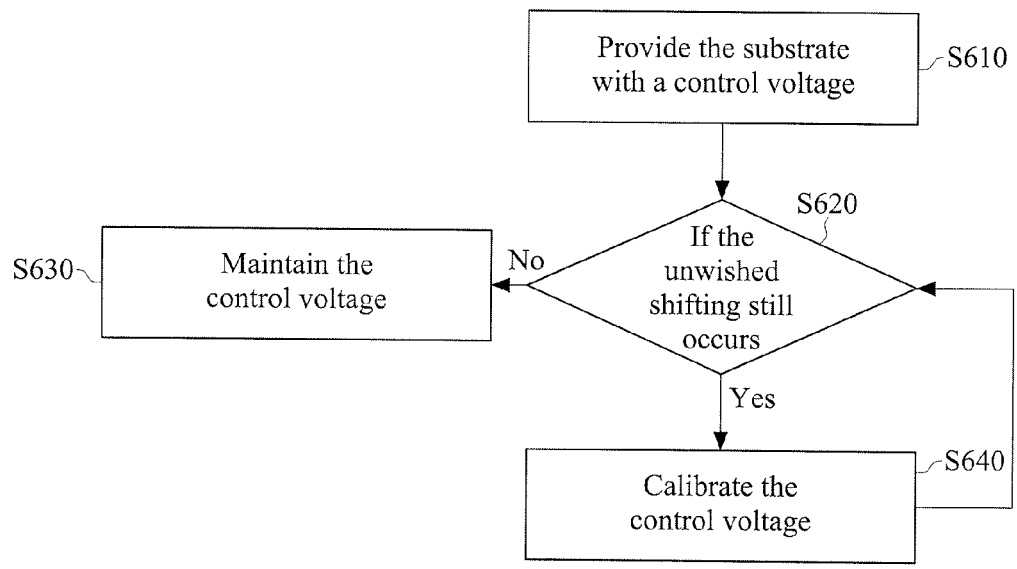
FIG. 6 is a flow chart of a signal attenuation-proof method of the micro-electromechanical apparatus in another embodiment.

Please refer to FIG. 6, where a flow chart of a signal attenuation-proof method of the micro-electromechanical apparatus 300 is shown. The signal attenuation-proof method includes the following steps. In step S610, a control voltage is provided to the substrate 310, and the control voltage has a polarity equal to a polarity of an electronic signal generated and propagating within the sensing unit 130 when the force is applied to the micro-electromechanical apparatus 300. In step S620, determine whether the unwished shifting of the mass bulk 132 occurs. If the mass bulk 132 has returned to its default position, the control voltage maintains at the current value, as shown in step S630. If the unwished shifting of the mass bulk 132 still occurs, the control voltage is being calibrated until the mass bulk 132 has returned to its default position or until the control voltage arrives at its limitation, as shown in step S640. The detailed information about the detection of the unwished shifting of the mass bulk 132 and the structure of the micro-electromechanical apparatus 300 can be referred to the previous description.

As set forth above, the disclosure may dope impurity atoms in the doped region of the substrate to make the polarity of the doped region equal to the polarity of the electronic signal in the sensing unit or may directly provide the substrate with a control voltage having the same polarity as the electronic signal, so repulsion effect may occur between the substrate and the sensing unit. Therefore, the electronic signal may have no signal loss flowing to the substrate and then maintain its original intensity and output power. Also, the signal processing circuits for processing the electronic signal may be simplified.

Furthermore, the disclosure also provides a signal attenuation-proof method applied to the above micro-electromechanical apparatus, where when the unwished shifting of the mass bulk occurs, a variable control voltage is supplied to the substrate to enhance the repulsion effect between the substrate and the sensing unit and the mass bulk may return to it default position. Therefore, even though the elastic components loss their elasticity bit by bit during their lifespan, the repulsion effect may still be sufficient for avoiding the occurrence of signal leakage flowing toward the substrate.

What is claimed is:

1. A micro-electromechanical apparatus having a signal attenuation-proof function and comprising:
    a substrate having a doped region into which an impurity is doped;
    an insulation layer located on the substrate; and
    a sensing unit located above the insulation layer, separated from the substrate and comprising a mass bulk, movable electrodes, fixed electrodes, and elastic components, the movable electrodes spaced from and facing the fixed electrodes respectively, the elastic components suspending the mass bulk, the mass bulk coupled with the movable electrodes, and the mass bulk and the movable electrodes configured to vibrate in response to a force,
    wherein the doped region is located directly below the sensing unit.

2. The micro-electromechanical apparatus according to claim 1, wherein the mass bulk contains polycrystalline silicon, and the elastic components are metallic.

3. The micro-electromechanical apparatus according to claim 1, wherein the doped impurity is made of a Group 5 or Group 3 material.

4. The micro-electromechanical apparatus according to claim 1, further comprising:
    a controller electrically connected to the substrate and the sensing unit and configured to determine whether the mass bulk has left a default position when no force is applied to the micro-electromechanical apparatus, and to supply a control voltage to recover the default position of the mass bulk when the mass bulk has left the default position and no force is applied to the micro-electromechanical apparatus.

5. The micro-electromechanical apparatus according to claim 1, wherein when the two different voltage potentials are respectively applied to the movable electrode and the fixed electrode, an electronic signal having a polarity equal to a polarity of a majority of conductive carriers in the doped region is formed and propagates in the sensing unit.

6. The micro-electromechanical apparatus according to claim 1, wherein when two different voltage potentials are respectively applied to the movable electrode and the fixed electrode, an electronic signal having a polarity equal to a polarity of the control voltage is formed and propagates in the sensing unit.

7. The micro-electromechanical apparatus according to claim 4, wherein to determine whether the mass bulk has left the default position when no force is applied to the micro-electromechanical apparatus, the controller determines whether capacitances between the fixed electrodes and the movable electrodes are different from a default capacitance; and when the capacitances between the fixed electrodes and the movable electrodes are different from the default capacitance, the controller determines that the mass bulk has left the default position when no force is applied to the micro-electromechanical apparatus.

8. A manufacturing method of a micro-electromechanical apparatus comprising:
   forming a substrate having a doped region into which an impurity is doped;
   forming an insulation layer on the substrate; and
   forming a sensing unit directly above the doped region, the sensing unit comprising a mass bulk, movable electrodes, fixed electrodes, and elastic components above the insulation layer, the movable electrodes spaced from and facing the fixed electrodes respectively, the mass bulk coupled with the movable electrodes, and the elastic components suspending the mass bulk, and the sensing unit separated from the substrate,
   wherein when two different voltage potentials are respectively applied to the movable electrode and the fixed electrode, an electronic signal having a polarity equal to a polarity of a majority of conductive carriers in the doped region is formed and propagates in the sensing unit.

9. The manufacturing method according to claim 8, wherein the mass bulk contains polycrystalline-silicon, and the elastic component is metallic.

10. The manufacturing method according to claim 8, wherein the doped impurity is made of a Group 5 or Group 3 material.

11. The manufacturing method according to claim 8, further comprising:
   disposing a controller that is electrically connected to the substrate and the sensing unit and is configured to determine whether the mass bulk has left a default position when no force is applied to the micro-electromechanical apparatus, and to supply a control voltage to recover the default position of the mass bulk when the mass bulk has left the default position and no force is applied to the micro-electromechanical apparatus.

12. A micro-electromechanical apparatus having a signal attenuation-proof function and comprising:
   a substrate configured to receive a control voltage;
   an insulation layer located on the substrate; and
   a sensing unit located above the insulation layer, separated from the substrate and comprising a mass bulk, movable electrodes, fixed electrodes, and elastic components, the movable electrodes spaced from and facing the fixed electrodes respectively, the elastic components suspending the mass bulk, the mass bulk coupled with the movable electrodes, and the mass bulk and the movable electrodes configured to vibrate in response to a force,
   wherein the doped region is located directly below the sensing unit.

13. The micro-electromechanical apparatus according to claim 12, further comprising:
   a controller electrically connected to the substrate and the sensing unit and configured to determine whether the mass bulk has left a default position when no force is applied to the micro-electromechanical apparatus, and to calibrate the control voltage to recover the default position of the mass bulk when the mass bulk has left the default position and no force is applied to the micro-electromechanical apparatus.

14. The micro-electromechanical apparatus according to claim 13, wherein to determine whether the mass bulk has left the default position when no force is applied to the micro-electromechanical apparatus, the controller determines whether capacitances between the fixed electrodes and the movable electrodes are different from a default capacitance; and when the capacitances between the fixed electrodes and the movable electrodes are different from the default capacitance, the controller determines that the mass bulk has left the default position when no force is applied to the micro-electromechanical apparatus.

15. The micro-electromechanical apparatus according to claim 12, wherein the mass bulk contains polycrystalline silicon, and the elastic component is metallic.

16. A signal attenuation-proof method applied to a micro-electromechanical apparatus that comprises a substrate, an insulation layer on the substrate, and a sensing unit above the insulation layer, the sensing unit comprising a mass bulk, movable electrodes, fixed electrodes and elastic components, the movable electrodes spaced from and facing the fixed electrodes respectively, the elastic components suspending the mass bulk, the mass bulk coupled with the movable electrodes, and the mass bulk and the movable electrodes configured to vibrate in response to a force applied to the micro-electromechanical apparatus, and the signal attenuation-proof method comprising:
   providing the substrate with a control voltage having a polarity equal to a polarity of an electronic signal generated and propagating within the sensing unit when two different voltage potentials are respectively applied to the movable electrode and the fixed electrode,
   wherein the sensing unit is separated from the substrate, and
   wherein the doped region is located directly below the sensing unit.

17. The signal attenuation-proof method according to claim 16, further comprising:
   determining whether the mass bulk has left a default position when no force is applied to the micro-electromechanical apparatus; and
   calibrating the control voltage to recover the default position of the mass bulk when the mass bulk has left the default position and no force is applied to the micro-electromechanical apparatus.

18. The signal attenuation-proof method according to claim 16, wherein the substrate has a doped region into which an impurity is doped, and a polarity of a majority of conductive carriers in the doped region is equal to the polarity of the electronic signal.

19. The signal attenuation-proof method according to claim 17, wherein when no force is applied to the micro-electromechanical apparatus, determining whether the mass bulk has left the default position comprises:

determining whether capacitances between the fixed electrodes and the movable electrodes are different from a default capacitance; and determining that the mass bulk has left the default position when the capacitances between the fixed electrodes and the movable electrodes are different from the default capacitance and no force is applied to the micro-electromechanical apparatus.

20. The signal attenuation-proof method according to claim 18, wherein the doped impurity is made of a Group 5 or Group 3 material.

* * * * *